(12) United States Patent
Johnson et al.

(10) Patent No.: US 10,921,714 B2
(45) Date of Patent: Feb. 16, 2021

(54) RESERVING SPATIAL LIGHT MODULATOR SECTIONS TO ADDRESS FIELD NON-UNIFORMITIES

(71) Applicant: Applied Materials, Inc., Santa Clara, CA (US)

(72) Inventors: Joseph R. Johnson, Redwood City, CA (US); Thomas L. Laidig, Richmond, CA (US); Christopher Dennis Bencher, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/895,971

(22) Filed: Jun. 8, 2020

(65) Prior Publication Data

US 2020/0301288 A1 Sep. 24, 2020

Related U.S. Application Data

(63) Continuation of application No. 16/597,718, filed on Oct. 9, 2019, now Pat. No. 10,705,433, which is a (Continued)

(51) Int. Cl.
*G03F 7/20* (2006.01)
*G03B 27/70* (2006.01)

(52) U.S. Cl.
CPC ......... *G03F 7/70358* (2013.01); *G03B 27/70* (2013.01); *G03F 7/2008* (2013.01); *G03F 7/70391* (2013.01)

(58) Field of Classification Search
CPC ............... G03F 7/7055; G03F 7/70558; G03F 7/70608; G03F 7/70616; G03F 7/70291;
(Continued)

(56) References Cited

U.S. PATENT DOCUMENTS 5,567,334 A 10/1996 Baker et al.
6,643,007 B2 11/2003 Le
(Continued)

FOREIGN PATENT DOCUMENTS

CN 104111592 B 6/2016
CN 105652607 A 6/2016
(Continued)

OTHER PUBLICATIONS

International Search Report and Written Opinion issued in International Application No. PCT/US2019/040308, dated Oct. 23, 2019 (10 pages).
(Continued)

*Primary Examiner* — Steven Whitesell Gordon
(74) *Attorney, Agent, or Firm* — Patterson + Sheridan, LLP

(57) ABSTRACT

Embodiments of the present disclosure generally provide improved photolithography systems and methods using a digital micromirror device (DMD). The DMD comprises columns and rows of micromirrors disposed opposite a substrate. Light beams reflect off the micromirrors onto the substrate, resulting in a patterned substrate. Certain subsets of the columns and rows of micromirrors may be positioned to the "off" position, such that they dump light, in order to correct for uniformity errors, i.e., features larger than desired, in the patterned substrate. Similarly, certain subsets of the columns and rows of micromirrors may be defaulted to the "off" position and selectively allowed to return to their programmed position in order to correct for uniformity errors, i.e., features smaller than desired, in the patterned substrate.

21 Claims, 7 Drawing Sheets

Related U.S. Application Data continuation of application No. 16/116,126, filed on Aug. 29, 2018, now Pat. No. 10,503,076.

(58) Field of Classification Search
CPC ............. G03F 7/70375; G03F 7/70383; G03F 7/70391

See application file for complete search history.

(56) References Cited

U.S. PATENT DOCUMENTS

| | | | |
|---|---|---|---|
| 8,243,285 B2 | 8/2012 | Fishbaine | |
| 8,691,481 B2 * | 4/2014 | Ikeda | G03F 7/70425 |
| | | | 430/30 |
| 9,019,471 B2 | 4/2015 | Kim et al. | |
| 2001/0035944 A1 | 11/2001 | Sunagawa | |
| 2007/0103665 A1 | 5/2007 | Zimmerman et al. | |
| 2007/0127109 A1 | 6/2007 | Ishii | |
| 2008/0210888 A1 | 9/2008 | Inoue et al. | |
| 2010/0060874 A1 | 3/2010 | Kim et al. | |
| 2011/0199620 A1 | 8/2011 | Yun et al. | |
| 2011/0267594 A1 | 11/2011 | Kim et al. | |
| 2012/0002183 A1 * | 1/2012 | Ota | G03F 7/70291 |
| | | | 355/67 |
| 2015/0015859 A1 | 1/2015 | Yun et al. | |
| 2015/0341609 A1 | 11/2015 | Kilcher et al. | |
| 2016/0327869 A1 * | 11/2016 | Nagahara | G03F 7/70558 |
| 2017/0068163 A1 | 3/2017 | Laidig et al. | |
| 2018/0136567 A1 * | 5/2018 | Moriya | G03F 7/70391 |

FOREIGN PATENT DOCUMENTS

| | | |
|---|---|---|
| KR | 10-2015-0007369 A | 1/2015 |
| TW | 201308030 A | 2/2013 |
| TW | 201702756 A | 1/2017 |
| TW | 201818051 A | 5/2018 |

OTHER PUBLICATIONS

Taiwan Office Action dated May 25, 2020 for Application No. 108129599.

* cited by examiner

RESERVING SPATIAL LIGHT MODULATOR SECTIONS TO ADDRESS FIELD NON-UNIFORMITIES

CROSS-REFERENCE TO RELATED APPLICATIONS

This application is a continuation of U.S. patent application Ser. No. 16/597,718, filed Oct. 9, 2019, which is a continuation of U.S. patent application Ser. No. 16/116,126, filed Aug. 29, 2018, each of which is herein incorporated by reference.

BACKGROUND

Field

Embodiments of the present disclosure generally relate to apparatuses, systems and methods for processing one or more substrates, and more specifically to apparatuses, systems and methods for performing photolithography processes. More specifically, embodiments of the present disclosure relate to improved apparatuses, systems and methods for addressing field non-uniformities in substrates during processing.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels include a layer of liquid crystal material forming pixels sandwiched between two plates. When power from a power supply is applied across the liquid crystal material, an amount of light passing through the liquid crystal material is controlled at pixel locations enabling images to be generated.

Microlithography techniques have been employed to create electrical features incorporated as part of the liquid crystal material layer forming the pixels. According to these techniques, a light-sensitive photoresist is applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

In order to continue to provide display devices and other devices at the prices demanded by consumers, new apparatuses and approaches are needed to precisely and cost-effectively create patterns on substrates, such as large area substrates.

SUMMARY

Embodiments of the present disclosure generally provide improved photolithography systems and methods using a spatial light modulator such as a digital micromirror device (DMD). In one embodiment, a DMD device is disclosed. The DMD comprises columns of micromirrors disposed opposite a substrate. Light beams reflect off the micromirrors onto the substrate, resulting in a patterned substrate. Certain subsets of the columns of micromirrors may be positioned to the "off" position, such that they dump light, in order to correct for uniformity errors, i.e., accumulated exposure in the patterned substrate. Similarly, certain subsets of the columns of micromirrors may be defaulted to the "on" position and selectively allowed to return to their programmed position in order to correct for uniformity errors, i.e., an under exposed region, in the patterned substrate.

In one embodiment, a method for patterning a substrate using a DMD is disclosed. After the DMD scans the substrate, the substrate is evaluated for uniformity errors. If over-exposed regions are found, a subset of the columns of the DMD are set to the "off" position, such that light beams are reflected to the light dump instead of to the patterned substrate. The result is attenuation of the pattern in the designated areas of the substrate.

In another embodiment, another method for patterning a substrate using a DMD is disclosed. Before the DMD scans the substrate, a subset of columns of micromirrors of the DMD is set to the "off" position, acting as a reserve. After the DMD scans the substrate, the substrate is evaluated for uniformity errors. If underexposed regions are found, a subset of the reserved columns is activated such that the micromirrors are positioned as programmed. The result is that the pattern is assisted (i.e., the number of exposures is increased) in the designated areas of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1A is a perspective view of a photolithography system according to embodiments disclosed herein.

FIG. 1B is a perspective view of a photolithography system according to embodiments disclosed herein.

FIG. 2A is a perspective schematic view of an image projection apparatus according to embodiments disclosed herein.

FIG. 2B is a perspective schematic view of an image projection apparatus according to embodiments disclosed herein.

FIG. 3 is a schematic view of a digital micromirror device according to embodiments disclosed herein.

FIG. 4 is a flow chart of a method of patterning a substrate according to embodiments disclosed herein.

FIG. 5 is a flow chart of a method of patterning a substrate according to embodiments disclosed herein.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments of the present disclosure generally provide improved photolithography systems and methods using a digital micromirror device (DMD). In one embodiment, a DMD device is disclosed. The DMD comprises columns of micromirrors disposed opposite a substrate. Light beams reflect off the micromirrors onto the substrate, resulting in a patterned substrate. Certain subsets of the columns of micromirrors may be positioned to the "off" position, such that they dump light, in order to correct for uniformity errors, by decreasing in the number of exposures to the patterned substrate. Similarly, certain subsets of the columns of micromirrors may be defaulted to the "off" position and selectively allowed to return to their programmed position in order to correct for uniformity errors by increasing the number of exposures delivered to the patterned substrate.

Figure 1A:
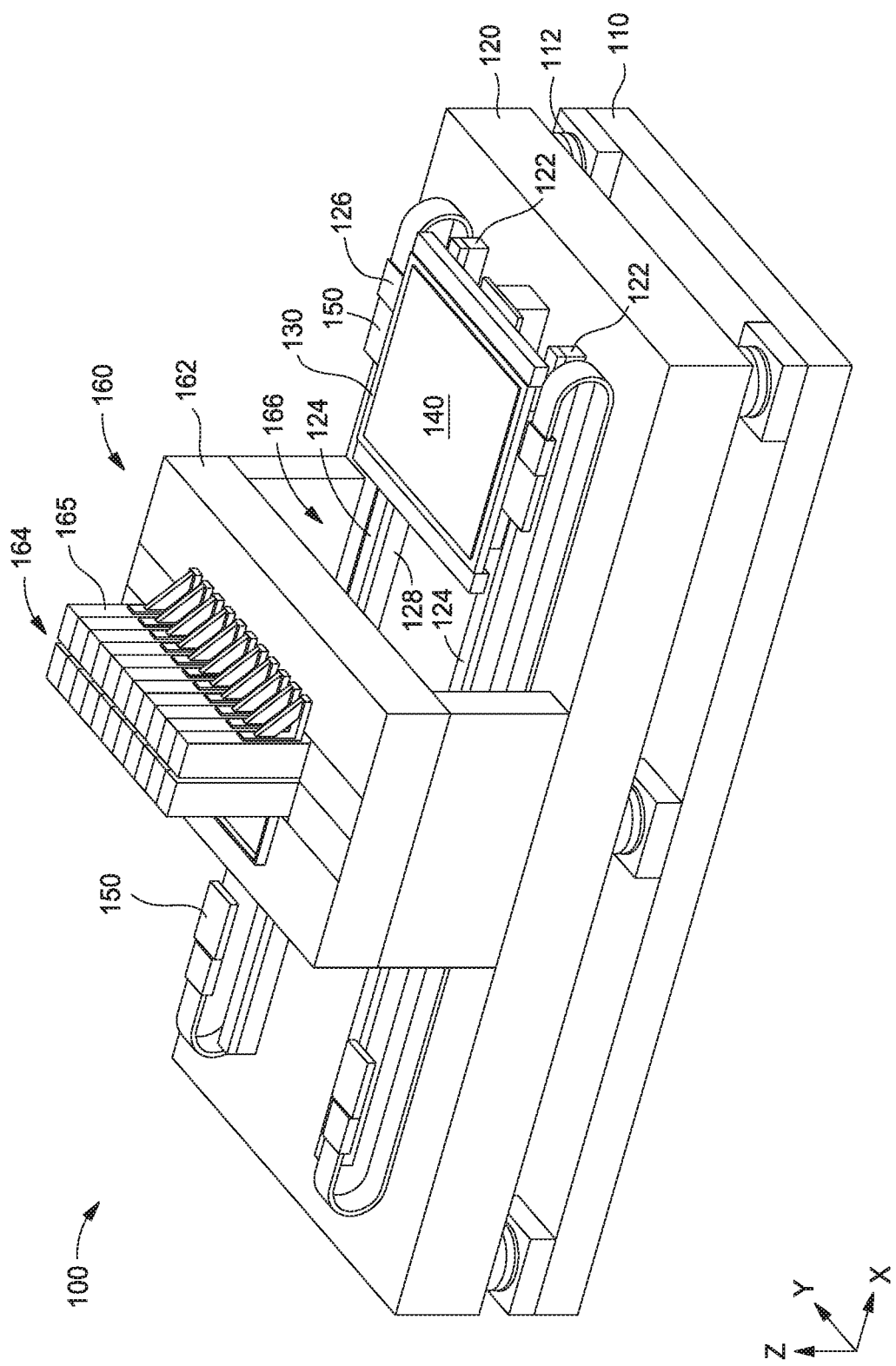

FIG. 1A is a perspective view of a photolithography system 100 according to embodiments disclosed herein. The system 100 includes a base frame 110, a slab 120, a stage 130, and a processing apparatus 160. The base frame 110 rests on the floor of a fabrication facility and supports the slab 120. Passive air isolators 112 are positioned between the base frame 110 and the slab 120. In one embodiment, the slab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

The substrate 140 comprises any suitable material, for example, quartz used as part of a flat panel display. In other embodiments, the substrate 140 is made of other materials. In some embodiments, the substrate 140 has a photoresist layer formed thereon. A photoresist is sensitive to radiation. A positive photoresist includes portions of the photoresist, which when exposed to radiation, will be respectively soluble to photoresist developer applied to the photoresist after the pattern is written into the photoresist. A negative photoresist includes portions of the photoresist, which when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, at least one of diazonaphthoquinone, a phenol formaldehyde resin, poly (methyl methacrylate), poly(methyl glutarimide), and SU-8. In this manner, the pattern is created on a surface of the substrate 140 to form the electronic circuitry.

The system 100 includes a pair of supports 122 and a pair of tracks 124. The pair of supports 122 are disposed on the slab 120, and the slab 120 and the pair of supports 122 are a single piece of material. The pair of tracks 124 are supported by the pair of the supports 122, and the stage 130 moves along the tracks 124 in the X-direction. In one embodiment, the pair of tracks 124 is a pair of parallel magnetic channels. As shown, each track 124 of the pair of tracks 124 is linear. In other embodiments, one or more track 124 is non-linear. An encoder 126 is coupled to the stage 130 in order to provide location information to a controller (not shown).

The processing apparatus 160 includes a support 162 and a processing unit 164. The support 162 is disposed on the slab 120 and includes an opening 166 for the stage 130 to pass under the processing unit 164. The processing unit 164 is supported by the support 162. In one embodiment, the processing unit 164 is a pattern generator configured to expose a photoresist in a photolithography process. In some embodiments, the pattern generator is configured to perform a maskless lithography process. The processing unit 164 includes a plurality of image projection apparatus (shown in FIGS. 2A and 2B). In one embodiment, the processing unit 164 contains as many as 84 image projection apparatus. Each image projection apparatus is disposed in a case 165. The processing apparatus 160 is useful to perform maskless direct patterning.

During operation, the stage 130 moves in the X-direction from a loading position, as shown in FIG. 1A, to a processing position. The processing position is one or more positions of the stage 130 as the stage 130 passes under the processing unit 164. During operation, the stage 130 is be lifted by a plurality of air bearings (not shown) and moves along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the Y-direction by moving along a track 150 for processing and/or indexing the substrate 140. The stage 130 is capable of independent operation and can scan a substrate 140 in one direction and step in the other direction.

A metrology system measures the X and Y lateral position coordinates of each of the stage 130 in real time so that each of the plurality of image projection apparatus can accurately locate the patterns being written in a photoresist covered substrate. The metrology system also provides a real-time measurement of the angular position of each of the stage 130 about the vertical or Z-axis. The angular position measurement can be used to hold the angular position constant during scanning by means of a servo mechanism or it can be used to apply corrections to the positions of the patterns being written on the substrate 140 by the image projection apparatus 270, shown in FIGS. 2A-2B. These techniques may be used in combination.

Figure 1B:
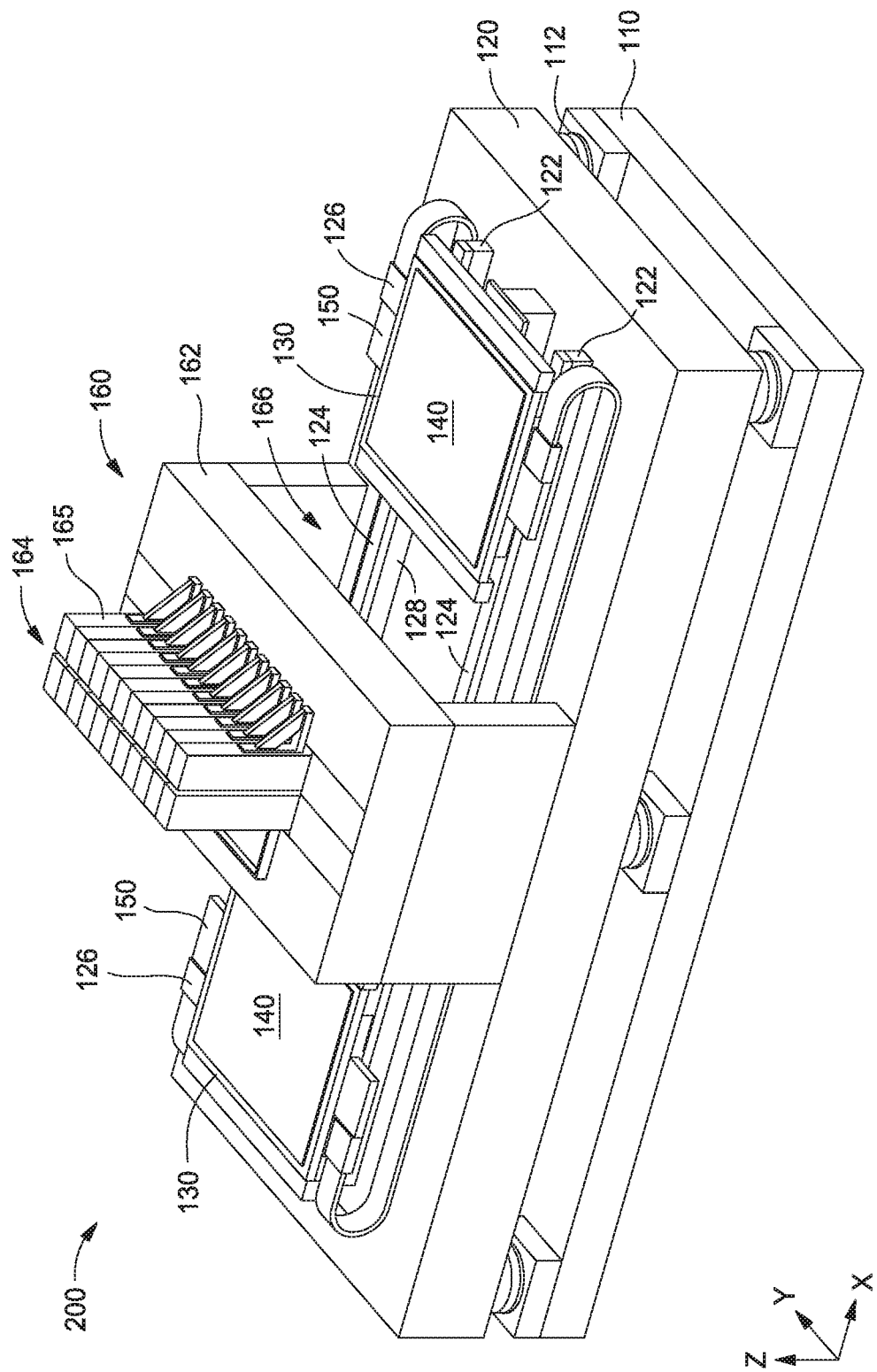

FIG. 1B is a perspective view of a photolithography system 200 according to embodiments disclosed herein. The system 200 is similar to the system 100; however, the system 200 includes two stages 130. Each of the two stages 130 is capable of independent operation and can scan a substrate 140 in one direction and step in the other direction. In some embodiments, when one of the two stages 130 is scanning a substrate 140, another of the two stages 130 is unloading an exposed substrate and loading the next substrate to be exposed.

While FIGS. 1A-1B depict two embodiments of a photolithography system, other systems and configurations are also contemplated herein. For example, photolithography systems including any suitable number of stages are also contemplated.

Figure 2A:
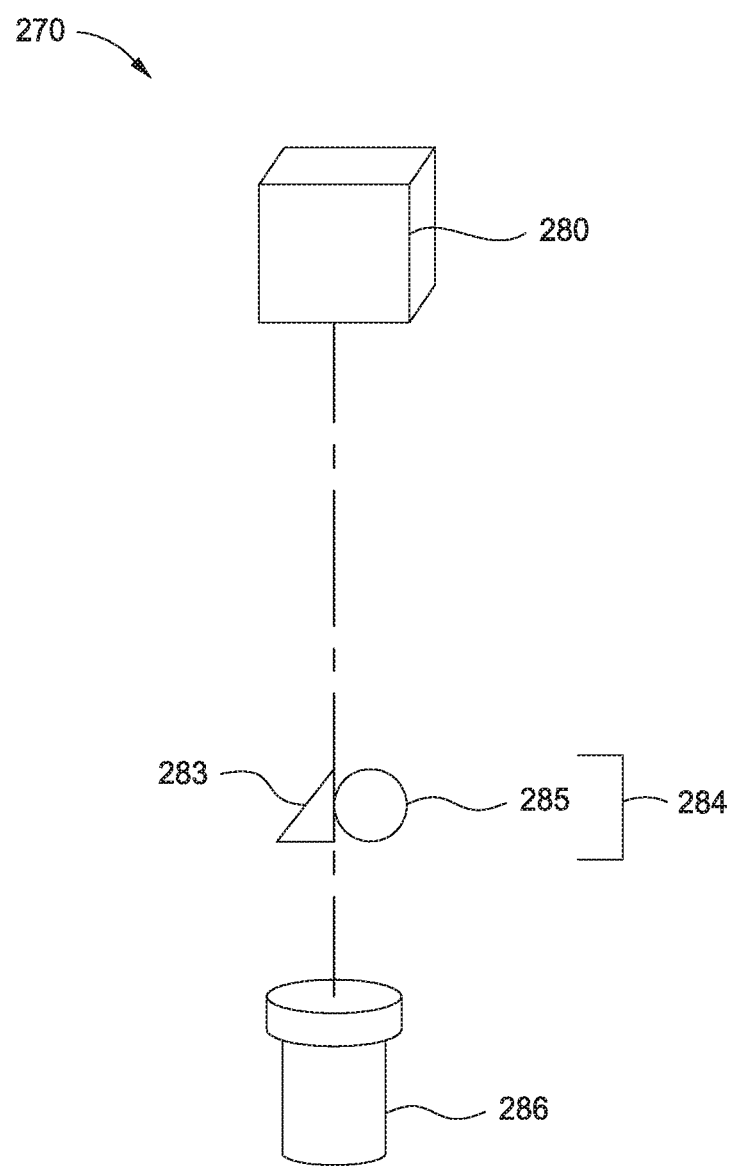

FIG. 2A is a perspective schematic view of an image projection apparatus 270 according to one embodiment, which is useful for a photolithography system, such as system 100 or system 200. The image projection apparatus 270 includes one or more spatial light modulators 280, an alignment and inspection system 284 including a focus sensor 283 and a camera 285, and projection optics 286. The components of image projection apparatus vary depending on the spatial light modulator being used. Spatial light modulators include, but are not limited to, microLEDs, VCSELs, any solid state emitters of electromagnetic radiation, digital micromirror devices (DMDs) and liquid crystal displays (LCDs).

In operation, the spatial light modulator 280 is used to modulate one or more properties of the light, such as amplitude, phase, or polarization, which is projected through the image projection apparatus 270 and to a substrate, such as the substrate 140. The alignment and inspection system 284 is used for alignment and inspection of the components of the image projection apparatus 270. In one embodiment, the focus sensor 283 includes a plurality of lasers which are directed through the lens of the camera 285 and back through the lens of the camera 285 and imaged onto sensors to detect whether the image projection apparatus 270 is in focus. The camera 285 is used to image the substrate, such as substrate 140, to ensure the alignment of the image projection apparatus 270 and photolithography system 100 or 200 is correct or within a predetermined tolerance. The projection optics 286, such as one or more lenses, is used to project the light onto the substrate, such as the substrate 140.

Figure 2B:
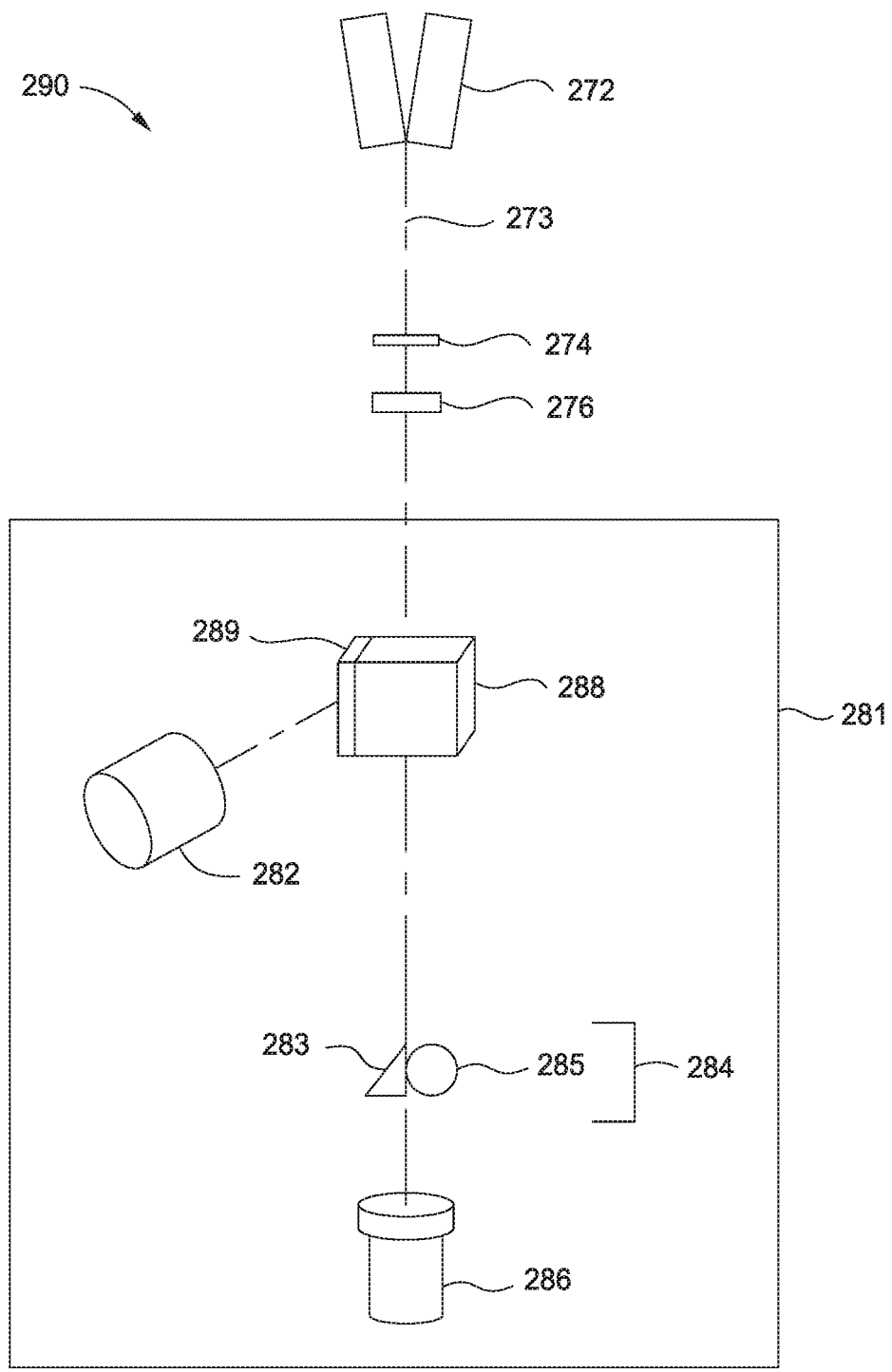

FIG. 2B is an image projection apparatus 281 according to embodiments described herein. In the embodiment shown in FIG. 2B, the image projection apparatus 281 uses one or more DMDs 289 as the spatial light modulator(s). The image projection apparatus 281 is part of an image projection system 290, which includes a light source 272, an aperture 274, a lens 276, a frustrated prism assembly 288, one or more DMDs 289 (one is shown), and a light dump 282, in addition to the alignment and inspection system 284 and the projection optics 286. The light source 272 is any suitable light source, such as a light emitting diode (LED) or a laser, capable of producing a light having predetermined wavelength. In one embodiment, the predetermined wavelength is in the blue or near ultraviolet (UV) range, such as less than about 450 nm. The frustrated prism assembly 288 includes a plurality of reflective surfaces. The projection lens 286 is, as an example, a 10× objective lens. During operation of the image projection apparatus 281 shown in FIG. 2B, a light beam 273 having a predetermined wavelength, such as a wavelength in the blue range, is produced by the light source 272. The light beam 273 is reflected to the DMD 289 by the frustrated prism assembly 288. The DMD 289 includes a plurality of mirrors, and the number of mirrors corresponds to the number of pixels to be projected. The plurality of mirrors are individually controllable, and each mirror of the plurality of mirrors is at an "on" position or "off" position, based on the mask data provided to the DMD 289 by the controller (not shown). When the light beam 273 reaches the mirrors of the DMD 289, the mirrors that are at "on" position reflect the light beam 273, i.e., forming the plurality of write beams, to the projection lens 286. The projection lens 286 then projects the write beams to the surface of the substrate 140. The mirrors that are at "off" position reflect the light beam 273 to the light dump 282 instead of the surface of the substrate 140.

In some cases, errors may occur that introduce uniformity errors across the field. For example, the light beam 273 that projects onto the mirrors of the DMD 289 may have some errors such that a higher intensity light projects onto one area of the DMD 289 and a lower intensity light projects onto another area of the DMD 289. As a result, the plurality of write beams projected to the surface of the substrate 140 may incorporate uniformity errors such that more light is projected in one area of the surface of the substrate 140 and less light is projected in another area of the surface of the substrate 140. Embodiments in the present disclosure improve methods and devices to reduce these uniformity errors.

Figure 3:
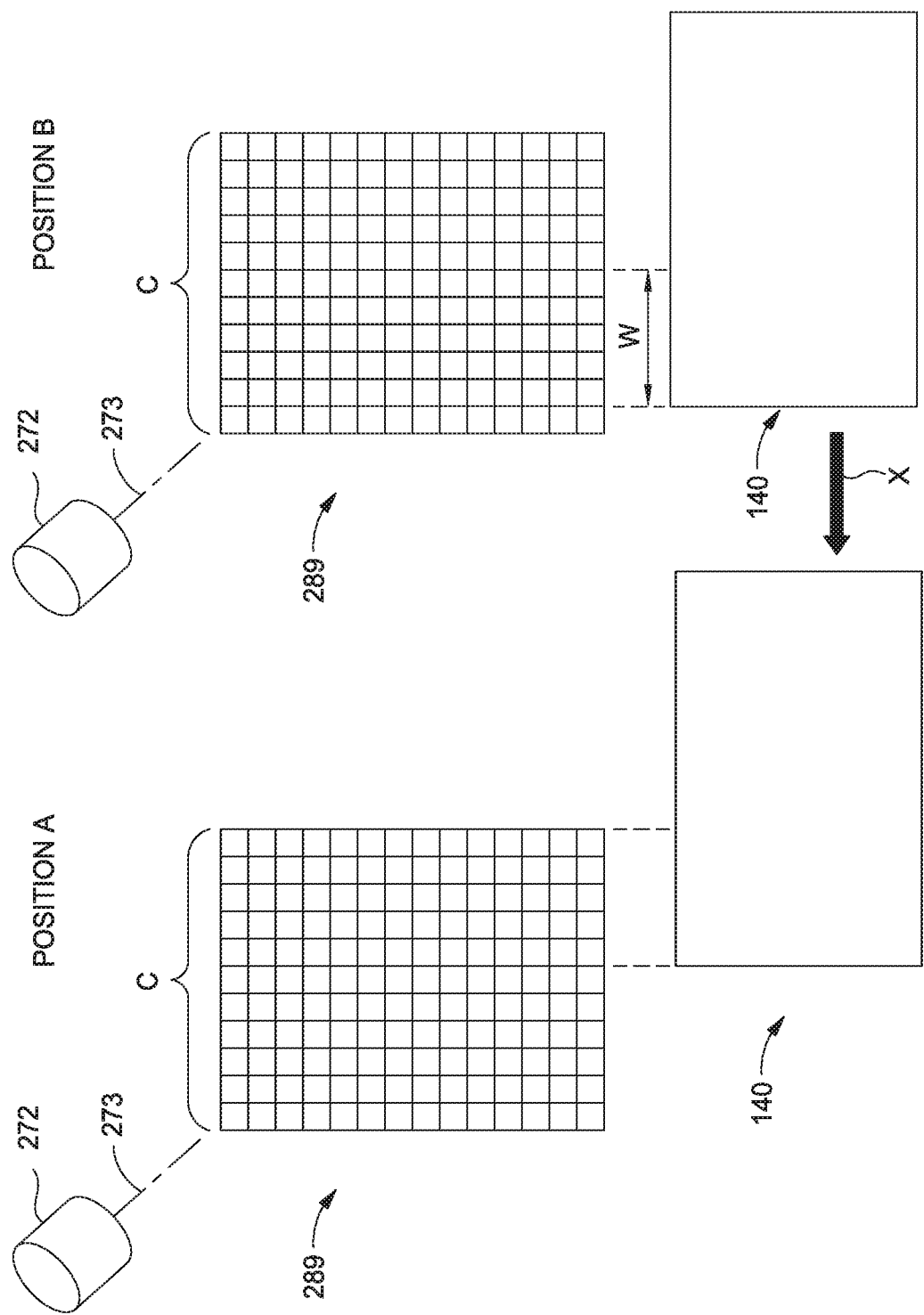

FIG. 3 is a schematic view of a substrate 140 traveling relative to a DMD 289. The mirrors of the DMD 289 are arranged in rows and columns. The total number of columns of mirrors of the DMD 289 is represented by the letter C. The substrate 140 moves at a certain velocity relative to the DMD 289. Similarly, the light beam 273 flashes from light source 272 at a regular interval. The substrate 140 moves at a rate such that between flashes of the light beam 273, the substrate 140 travels a distance W in the X direction relative to the DMD 289. The distance W corresponds to a number of columns Q of mirrors of the DMD 289. The total number of exposures taken as the DMD 289 scans the entire substrate 140 one time is represented by the letter T. The total number of columns C of mirrors of the DMD 280 divided by the total number of exposures T taken during a single scan equals the number of columns Q traveled by the DMD 280 during a single interval.

Figure 4:
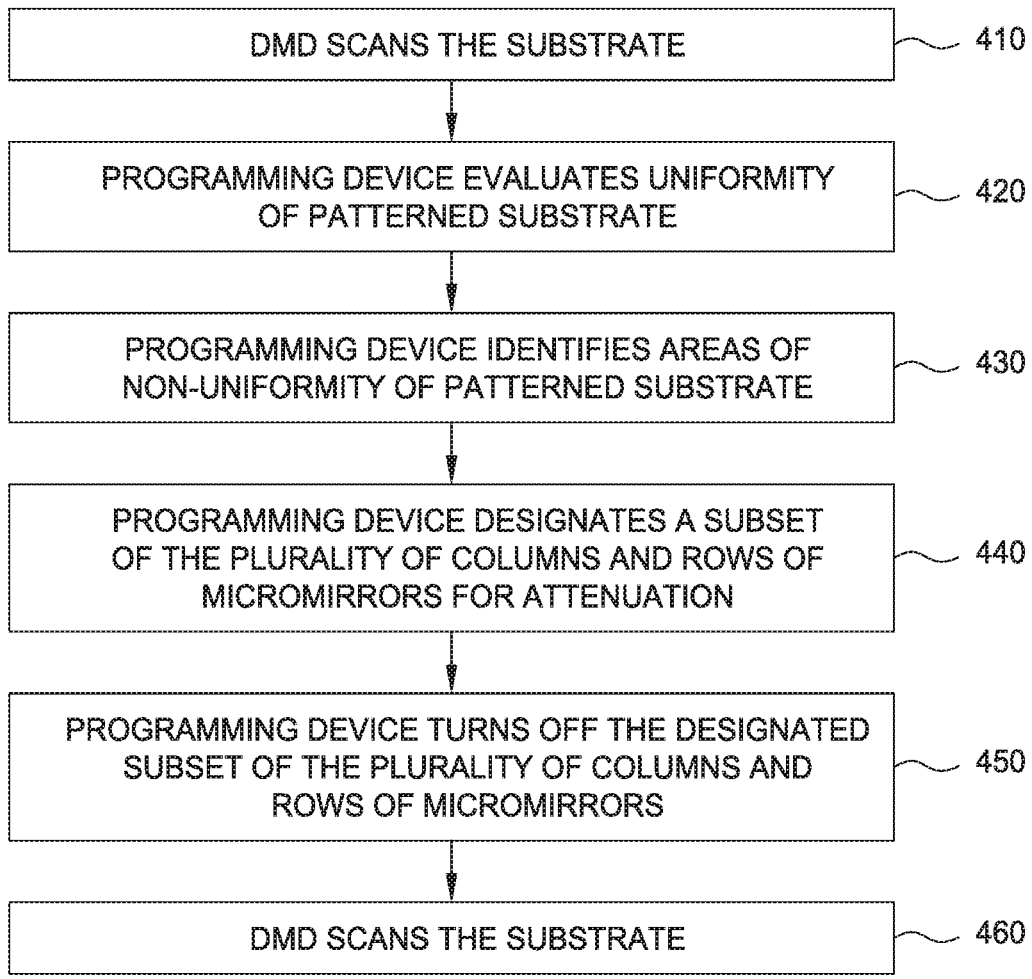

FIG. 4 is a flow chart of a method of patterning a substrate to provide for attenuation of light beams in areas of over exposure. In 410, the DMD 289 scans the substrate 140, patterning the substrate as indicated by the solid state programming device. In 420, the solid state programming device evaluates the uniformity of the patterned substrate 140. In one embodiment, evaluating the uniformity of the patterned substrate 140 comprises comparing the intensity or dimensions of the features of the patterned substrate 140. In 430, the programming device identifies areas of non-uniformity in the patterned substrate. For example, areas of non-uniformity may be indicated by features that do not have the correct dimensions, i.e., in this embodiment, the features are larger than intended. Features that are larger than intended can be corrected by reducing the number of exposures received in the area of the patterned substrate 140 where such features appear. At 440, to correct for the non-uniformity error, the programming device designates a subset of the plurality of columns and rows of micromirrors for attenuation during the next scan or scans of the DMD. At 450, columns and rows of micromirrors designated for attenuation are columns and rows in which the micromirrors turned to the "off" position, i.e., are positioned to reflect the light beams 273 into the light dump rather than onto the surface of the substrate 140. At 460, the DMD again scans the substrate with the designated subset of columns and rows of micromirrors set to the "off" position. The period of time for the deactivation of the designated columns and rows of micromirrors is that period of time required for the DMD to scan the area designated for attenuation.

The resulting scan offers an improvement in the uniformity errors by reducing the number of exposures received in the areas of the patterned substrate 140 where such uniformity errors appear. In other words, the region designated for attenuation is exposed to one less pulse of the light beams 273 than the remainder of the patterned substrate 140. For example, if the DMD 289 contains 1600 columns, and an area on the substrate is set to receive 190 pulses of light beams 273, then the number of columns to be set to default to the "off" position equals 1600/190=8.42, rounded down to the nearest integer, which is 8. The designated 8 columns are set to default to "off" regardless of the previously programmed pattern. The result is that the corresponding area of the patterned substrate receives one less pulse than does the remainder of the patterned substrate for that single scan of the DMD 289. The resulting degree of attenuation in that area is 8/1600=0.5% attenuation. The improvement to uniformity may also be limited to a precise subset of rows within the columns designated for attenuation, rather than entire columns.

A person of ordinary skill in the art will understand the methods used to uncover uniformity errors in a patterned substrate. Uniformity errors may be found by comparing features of a patterned substrate to a desired pattern and identifying features that differ from the desired pattern. Uniformity errors may also be found using a photodiode. For example, a photodiode or other sensor may record the intensity of the light from the DMD 289 as the DMD scans across the substrate. The sensor may read non-uniformities of the light emitter during the scan. Uniformity errors may also be uncovered after further processing of a patterned substrate. For example, when a further processing step biases a certain area of the substrate, that bias may indicate a uniformity error in the patterning of the substrate.

Figure 5:
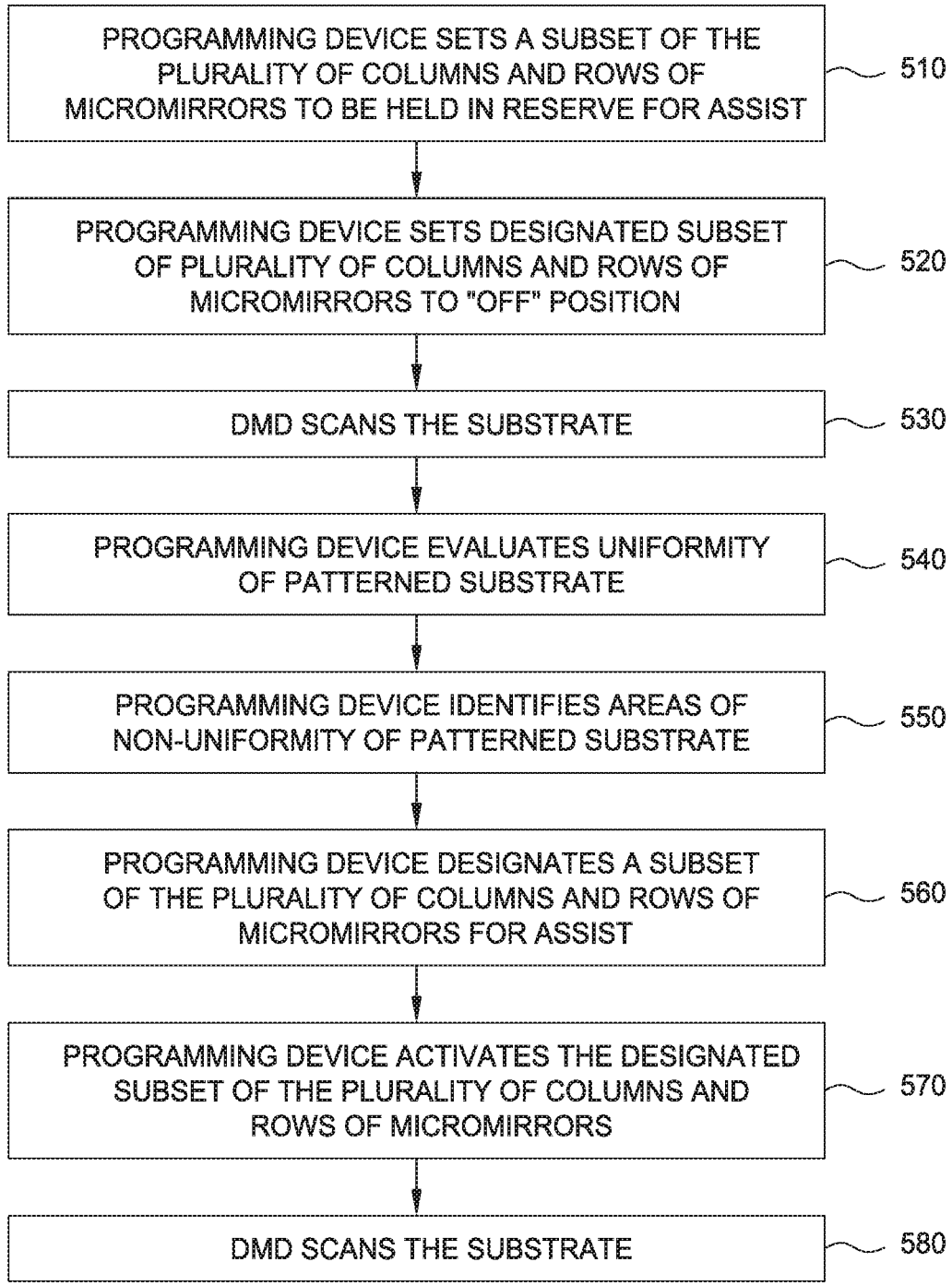

FIG. 5 is a flow chart of a method of patterning a substrate to provide an assist in areas where uniformity errors appear and may be corrected by increasing the number of exposures in areas of the patterned substrate 140 where features smaller than intended appear. In 510, the programming device designates a subset of the plurality of columns and rows of micromirrors of the DMD 289 to be deactivated and held in reserve for potential assist. In 520, the programming device sets the designated subset of the plurality of columns and rows of micromirrors to the "off" position, or deactivates them. In 530, the DMD 289 scans the substrate 140. During this scan, the micromirrors in the designated columns reflect the light beams 273 to the light dump. In 540, the programming device evaluates the uniformity of the patterned substrate 140. In one embodiment, evaluating the uniformity of the patterned substrate 140 comprises comparing the intensity or dimensions of the features of the patterned substrate 140 to a desired pattern. In 550, the programming device identifies areas of non-uniformity in the patterned substrate. For example, areas of non-uniformity may be indicated by features that do not have the correct dimensions, i.e., in this embodiment, features that are smaller than intended. Such features that are smaller than intended can be corrected by increasing the number of exposures relative to the number of exposures provided to surrounding areas of the patterned substrate 140. At 560, to correct for the non-uniformity error, the programming device designates a subset of the plurality of columns and rows of micromirrors that had been held in reserve at 520 for assist during the next scan or scans of the DMD 289. At 570, columns and rows of micromirrors designated for assist are columns and rows in which the micromirrors turned to their programmed positions, i.e., are positioned according to the pattern rather than deactivated or defaulted to reflect the light beams 273 into the light dump. At 580, the DMD 289 again scans the substrate with the designated subset of columns of micromirrors set to the patterned position. The period of time for the activation of the designated columns and rows of micromirrors is at least that period of time required for the DMD to scan the area designated for assist.

The situation may arise wherein, on a single patterned substrate 140, there appear one or more areas of non-uniformity requiring attenuation as well as one or more areas of non-uniformity requiring assist. In such cases, the DMD may be programmed to accommodate both attenuation and assist in the appropriate areas.

The embodiments disclosed herein provide methods and devices for improving uniformity errors in patterning substrates using DMD 289. These methods are improvements over other considered methods for addressing non-uniformity. For example, attempts were made to attenuate exposure intensity on a random basis, by randomly selecting micromirrors to direct light beams 273 to light dump. However, this method resulted in "clumping," i.e., too many micromirrors in close proximity being programmed to dump light beams 273. However, the embodiments disclosed herein provide a uniform way to address the problems of increased or decreased exposure intensity without clumping.

While the foregoing is directed to examples of the present disclosure, other and further examples of the disclosure may be devised without departing from the basic scope thereof, and the scope thereof is determined by the claims that follow.

What is claimed is:

1. A method for patterning a substrate using a spatial light modulator, wherein the spatial light modulator comprises a plurality of light emitters, the method comprising:
scanning the substrate with the spatial light modulator;
evaluating a uniformity of the substrate, the evaluating the uniformity of the substrate comprising evaluating one or more dimensions of one or more features of the substrate;
identifying an area of non-uniformity of the substrate;
designating a subset of the plurality of light emitters for attenuation or assist; and
turning off or on the designated subset of the plurality of light emitters, wherein the designated subset of the plurality of light emitters is turned off if designated for attenuation, or the designated subset of the plurality of light emitters is turned on if designated for assist.

2. The method of claim 1, wherein the plurality of light emitters comprises a plurality of rows of light emitters and a plurality of columns of light emitters, and the designated subset of the plurality of light emitters comprises one or more of a subset of the plurality of rows of light emitters or a subset of the plurality of columns of light emitters.

3. The method of claim 1, wherein the identifying the area of non-uniformity of the substrate comprises locating areas of difference between the substrate and a desired pattern, the areas of difference comprising one or more features of the substrate that are larger or smaller than one or more features of the desired pattern, the subset of the plurality of light emitters is designated for attenuation if the one or more features of the substrate are larger than the one or more features of the desired pattern, and the subset of the plurality of light emitters is designated for assist if the one or more features of the substrate are smaller than the one or more features of the desired pattern.

4. The method of claim 1, wherein the designating the plurality of light emitters for attenuation or assist comprises selecting the subset of the plurality of light emitters that corresponds to the area of non-uniformity of the substrate; and the method further comprises scanning an additional substrate with the spatial light modulator after turning off or on the designated subset of the plurality of light emitters.

5. The method of claim 1, wherein the designated subset of the plurality of light emitters is turned off or on for a period of time, the period of time comprising a time required for the spatial light modulator to scan across the area of non-uniformity of the substrate.

6. The method of claim 1, wherein the scanning the substrate with the spatial light modulator comprises a movement of a distance W in a position of the substrate, and a number of light emitters in the subset of the plurality of light emitters is equal to a number of light emitters in the distance W rounded down to the nearest integer.

7. The method of claim 6, wherein the movement of the distance W is determined by dividing a total number of light emitters of the spatial light modulator by a total number of exposures in a single scan of the spatial light modulator.

8. The method of claim 1, wherein the designated subset of the plurality of light emitters is on during the scanning and is turned off if designated for attenuation, or the designated subset of the plurality of light emitters is off during the scanning and is turned on if designated for assist.

9. A non-transitory computer-readable medium having instructions that are configured to cause a system to:
- scan a substrate with a spatial light modulator, the spatial light modulator comprising a plurality of light emitters;
- evaluate a uniformity of the substrate, the evaluating the uniformity of the substrate comprising evaluating one or more dimensions of one or more features of the substrate;
- identify an area of non-uniformity of the substrate;
- designate a subset of the plurality of light emitters for attenuation or assist; and
- turn off or on the designated subset of the plurality of light emitters, wherein the designated subset of the plurality of light emitters is turned off if designated for attenuation, or the designated subset of the plurality of light emitters is turned on if designated for assist.

10. The non-transitory computer-readable medium of claim 9, wherein the plurality of light emitters comprises a plurality of rows of light emitters and a plurality of columns of light emitters, and the designated subset of the plurality of light emitters comprises one or more of a subset of the plurality of rows of light emitters or a subset of the plurality of columns of light emitters.

11. The non-transitory computer-readable medium of claim 9, wherein the identifying the area of non-uniformity of the substrate comprises locating areas of difference between the substrate and a desired pattern, the areas of difference comprising one or more features of the substrate that are larger or smaller than one or more features of the desired pattern, and the designating the subset of the plurality of light emitters for attenuation or assist comprises selecting the subset of the plurality of light emitters that corresponds to the area of non-uniformity of the substrate, wherein the instructions are further configured to cause the system to scan an additional substrate with the spatial light modulator after turning on or off the designated subset of the plurality of light emitters.

12. The non-transitory computer-readable medium of claim 11, wherein:
- the subset of the plurality of light emitters is designated for attenuation if the one or more features of the substrate are larger than the one or more features of the desired pattern; and
- the subset of the plurality of light emitters is designated for assist if the one or more features of the substrate are smaller than the one or more features of the desired pattern.

13. The non-transitory computer-readable medium of claim 9, wherein the designated subset of the plurality of light emitters is turned off or on for a period of time, the period of time comprising a time required for the spatial light modulator to scan across the area of non-uniformity of the substrate.

14. The non-transitory computer-readable medium of claim 9, wherein the scanning the substrate with the spatial light modulator comprises a movement of a distance W in a position of the substrate, and a number of light emitters in the subset of the plurality of light emitters is equal to a number of light emitters in the distance W rounded down to the nearest integer.

15. The non-transitory computer-readable medium of claim 14, wherein the movement of the distance W is determined by dividing a total number of light emitters of the spatial light modulator by a total number of exposures in a single scan of the spatial light modulator.

16. A spatial light modulator for patterning a substrate, comprising:
- a plurality of light emitters, wherein a number of the plurality of light emitters is configured to be activated or deactivated as a unit; wherein the spatial light modulator is in communication with a controller configured to:
  - evaluate a uniformity of the substrate, the evaluating the uniformity of the substrate comprising evaluating one or more dimensions of one or more features of the substrate;
  - identify an area of non-uniformity of the substrate; and
  - designate a subset of the plurality of light emitters to be activated or deactivated as a unit.

17. The spatial light modulator of claim 16, wherein the subset of the plurality of light emitters comprises a designated number of light emitters, and the designated number of light emitters is determined by:
- dividing a total number of light emitters in the plurality of light emitters by a number of exposures in a scan of the spatial light modulator; and
- rounding down to the nearest integer.

18. The spatial light modulator of claim 16, wherein the subset of the plurality of light emitters is activated or deactivated as a unit for a period of time, the period of time comprising a time required for the spatial light modulator to move across the area of non-uniformity of the substrate.

19. The spatial light modulator of claim 16, wherein the controller is further configured to:
- determine whether the area of non-uniformity is an area of increased or decreased exposure relative to a surrounding field of the substrate.

20. The spatial light modulator of claim 19, wherein the controller is further configured to deactivate the subset of the plurality of light emitters if the area of non-uniformity is an area of increased exposure relative to a surrounding field of the substrate.

21. The spatial light modulator of claim 19, wherein the controller is further configured to activate the subset of the plurality of light emitters if the area of non-uniformity is an area of decreased exposure relative to a surrounding field of the substrate.

* * * * *